United States Patent [19]

Kamiya et al.

[11] Patent Number: 4,909,183
[45] Date of Patent: Mar. 20, 1990

[54] APPARATUS FOR PLASMA CVD

[75] Inventors: Osamu Kamiya, Machida; Yasutomo Fujiyama, Kawasaki, both of Japan

[73] Assignee: Canon Kabushiki Kaisha, Tokyo, Japan

[21] Appl. No.: 358,510

[22] Filed: May 30, 1989

Related U.S. Application Data

[63] Continuation of Ser. No. 204,919, Jun. 9, 1988, abandoned, which is a continuation of Ser. No. 915,925, Oct. 6, 1986, abandoned, which is a continuation of Ser. No. 623,935, Jun. 25, 1984, abandoned.

[30] Foreign Application Priority Data

Jun. 30, 1983 [JP] Japan .................. 58-116842

[51] Int. Cl.[4] .............................................. C23C 16/00
[52] U.S. Cl. ...................... 118/723; 118/725; 118/730; 118/50.1; 427/38; 427/39
[58] Field of Search .................... 427/38, 39; 118/723, 118/725, 730, 50.1

[56] References Cited

U.S. PATENT DOCUMENTS

| | | | |
|---|---|---|---|
| 3,865,072 | 2/1975 | Kirkman | 118/730 X |
| 4,142,004 | 2/1979 | Hauser, Jr. et al. | 118/730 X |
| 4,223,048 | 9/1980 | Engle | 427/39 |
| 4,282,267 | 8/1981 | Kayel | 427/45.1 X |
| 4,404,076 | 9/1983 | Nakagawa et al. | 427/39 X |
| 4,422,407 | 12/1983 | Bessot | 118/723 |
| 4,438,188 | 3/1984 | Shimatoni et al. | 427/39 X |
| 4,466,380 | 8/1984 | Jansen et al. | 118/723 X |
| 4,501,766 | 2/1985 | Suzuki et al. | 427/38 |

Primary Examiner—Richard Bueker
Attorney, Agent, or Firm—Fitzpatrick, Cella, Harper & Scinto

[57] ABSTRACT

An apparatus for Plasma CVD process comprises a vacuum chamber in which a plural number of substrates being placed along a circle and separately from each other, and means for passing a starting gas or an evacuating gas through gaps between the adjacent substrates.

6 Claims, 2 Drawing Sheets

APPARATUS FOR PLASMA CVD

This application is a continuation of application Ser. No. 204,919, filed June 9, 1988 now abandoned, which, in turn, is a continuation of application Ser. No. 915,925, filed Oct. 6, 1986, now abandoned, which is a continuation of application Ser. No. 623,935, filed June 25, 1984, now abandoned.

BACKGROUND OF THE INVENTION

1. Field of the Invention

The present invention relates to an apparatus for Plasma Chemical Vapor Deposition (hereinafter referred to as Plasma CVD).

2. Description of the Prior Art

The Plasma CVD has recently attracted attention as a process for forming a film by deposition. The process comprises highly reducing a pressure in a reaction chamber, introducing starting gases into a reaction chamber and decomposing said gases by glow discharge upon arc discharge to form a deposited film on a substrate which is placed in the reaction chamber.

A film of an amorphous silicon (hereinafter referred to as a-Si), which is produced from a silane ($SiH_4$) gas as a starting gas, has relatively less localized energy level in a forbidden band of a-Si, thereby enabling one to control electronegativity by doping an impurity of the substitutional type. Thus, an a-Si may be used as an electrophoto-sensitizing member.

FIG. 1 shows a Plasma CVD apparatus to form a layer of a-Si on a cylindrical substrate 3, and more particularly, a cross-sectional view of typical so-called batch type Plasma CVD apparatus which comprises a single vacuum chamber 1 and 10.

A rotating means 5 which driven by motor M is provided at a center of a vacuum chamber body 10 at its base. The cylindrical substrate 3 is placed on and fastened to the rotating means 5 and heated with a heater 4 provided therein. The heating is necessary for maintaining the substrate at a higher temperature, for example, at 250° C., in order to form a stable a-Si layer on the substrate 3. A cylindrical shaped cathode electrode 2 connecting to a high frequency power source 7 is positioned around the substrate, and is protected with a cylindrical shield 6 in order to confine a plasma within the shield. A gas supply unit 8 has an inlet at the bottom of the shield 6 so as to introduce a starting gas, such as silane gas, into the reaction chamber. An evacuating unit 9 for evacuating the reaction chamber has an opening at the bottom of the vacuum chamber body 10.

According to the apparatus of the present invention, after heating the substrate 3 and upwardly introducing the starting gas into the reaction furnace (within the shield 6) from the bottom, radio frequency power is applied to the cathode electrode 2 from the power source 7 thereby creating a plasma discharge between electrode 2 and the substrate 3 which is used as an anode electrode. The starting silane gas is decomposed to form a-Si film on the substrate 3. The remaining gas, which is not reacted, is removed by holes 6a provided at upper part of the shield 6, passes downwardly through a space between the outer surface of shield 6 and the inner surface of a vacuum chamber body 10, and is removed from the apparatus through the evacuating unit.

On the other hand, according to the prior known Plasma CVD apparatus, there is the drawback such that since a reaction apparatus may be used for forming film on the substrate, singly in each process, it is poor in efficiency as an industrial production system, particularly in mass production. Furthermore, since the plasma reaction takes place within the area in the reaction furnace surrounded by the shield, the deposited film is formed on a whole exposed surface area in the reaction furnace, that is, not only on the substrate surface, but also on the surface of a high frequency electrode (cathode) as well as inner surface of the shield. Accordingly, the ratio of an amount of deposited film to the introduced starting gas is so small that the wasted portion of the starting material may be larger. Additionally, a deposited a-Si film both on the cathode electrode surface and inner surface of the shield often peels off and attaches on the substrate as a contaminant, thereby causing a defect. Furthermore, since the inlet for introducing the starting gas or the outlet for evacuating the remaining gas is to be provided on the top or bottom face of the vacuum chamber due to a constructional requirement, the film deposited on the substrate forms unevenly according to the direction of a gas flow.

SUMMARY OF THE INVENTION

The object of the present invention is to provide an apparatus capable of forming films on the plural number of the substrates simultaneously, and an apparatus having excellent deposition efficiency.

According to the present invention, there is provided an apparatus for Plasma CVD process which comprises a vacuum chamber in which a plural number of substrates are placed along a circle and separately from each other, and means for passing a starting gas or an evacuating gas through gaps between the adjacent substrates.

DETAILED DESCRIPTION OF THE PREFERRED EMBODIMENT

Figure 1:
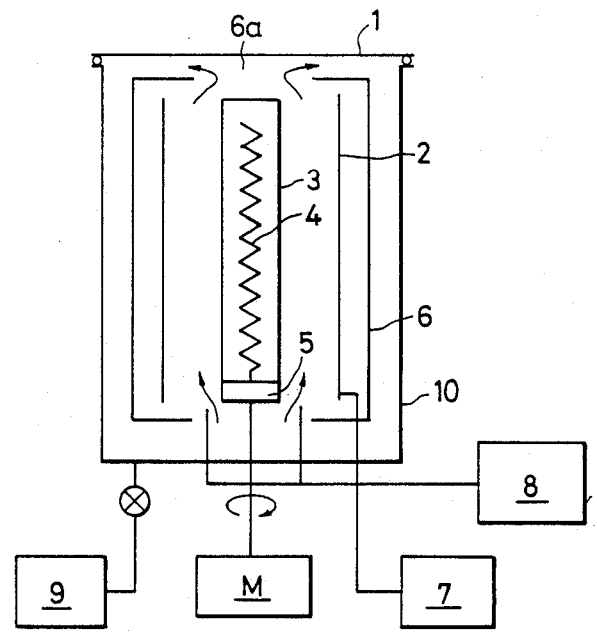
FIG. 1 shows a cross-sectional view of the prior known Plasma CVD apparatus.
Figure 2:
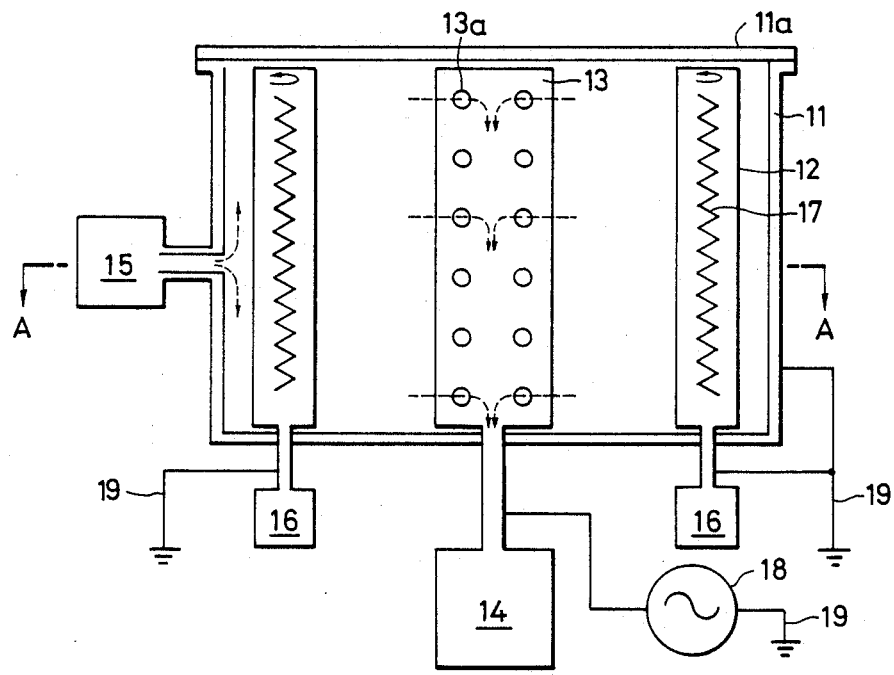
FIG. 2 shows a cross-sectional view of the Plasma CVD apparatus according to the present invention.
Figure 3:
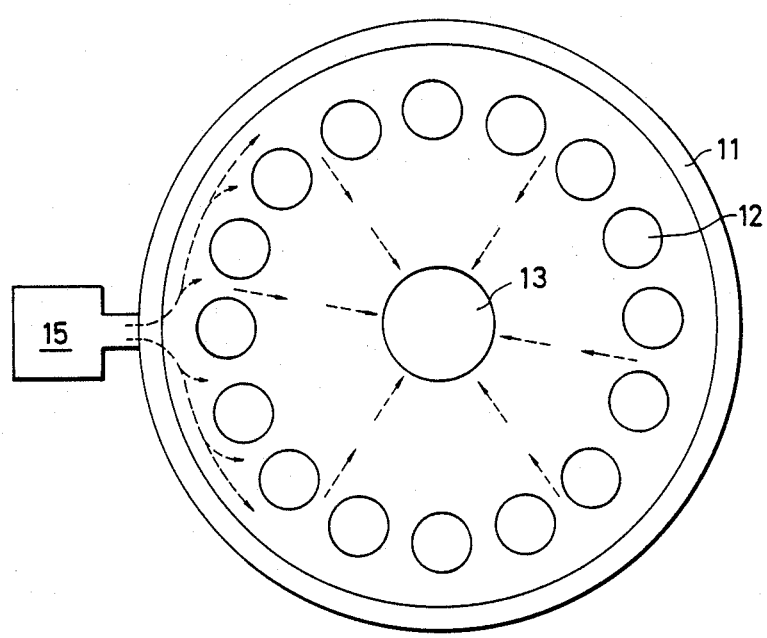
FIG. 3 shows a sectional view of the apparatus of FIG. 2 along A—A line.

Referring now to the drawings, an embodiment of the present invention is to be described in detail. FIG. 2 shows a cross-sectional view of one of the embodiments according to the present invention; and FIG. 3 shows top view of the A—A section of the apparatus shown in FIG. 2.

A cylindrical metallic member 13 is fixed on the center of the bottom face of a vacuum chamber 11 along the vertical axis of the chamber. A number of holes 13a are provided through a side face of the member 13, which is connected to an evacuating means 14 provided out of a vacuum chamber 11 and is capable of evacuating a gas from a reaction chamber.

The member 13 is electrically connected to a radio frequency power source 18 and is actuated as a cathode electrode.

Another terminal of the power source 18 is ground 19. At the bottom of the vacuum chamber 11 near the inner side face, several rotating means 16 for the substrate are provided, on which several cylindrical substrates 12, made of for example, aluminum, are individually mounted and fixed.

The rotating means 16 are rotated with the substrate 12 as illustrated in FIG. 2 during a deposition process while introducing the starting gases as disclosed herein, so that a uniform film may be formed by the deposition.

The substrates 12 are separately placed, preferably at an interval of approximately 0.5-1 mm. In each substrate 12, a heater 17 is provided in order to maintain the substrate temperature within a desired range. The substrate 12 may be assembled on or removed from the rotating means 16, by removing a cover 11a from the apparatus. There is also provided gas introducing unit 15 at a central part of the outer face of the vacuum chamber 11 for supplying starting gas.

In the preferred embodiment, since both the vacuum chamber 11 and substrate 12 are grounded, these are electrically maintained in the same level.

The typical process for forming a-Si film is illustrated as follows. The substrate 12 individually mounted and fixed on the plural rotating means 16, is heated with a heater 17 provided therein to the desired temperature to form a-Si film, and the rotating means is individually rotated along a vertical axis of the substrate. The substrate is grounded (19). The vacuum chamber 11 is evacuated by the vacuum unit 14 through the holes 13a formed on a side face of a metallic member, i.e. electrode 13 and maintained at a reduced pressure. Subsequently, a starting gas, i.e. silane (SiH$_4$) gas, is introduced.

The starting gas flows evenly towards the both ends of the substrate from the central part thereof as shown on the FIG. 2, and towards the holes 13a on the cathode electrode 13 through the space between inner surface of the vacuum chamber 11 and the substrate 12, subsequently through the substrate 12 as shown on the FIG. 3.

The remaining gas from a plasma reaction (described herein below) is exhausted out of the apparatus through the holes 13a by vacuum unit 14.

When a silane gas is supplied into a vacuum chamber 11, radio frequency power is applied to the cathode electrode 13 from the power source 18 thereby generating plasma discharge between cathode electrode 13 and the substrate which is an anode electrode to decompose the silane gas and form a-Si film on the substrate 12.

Thus, it is an advantageous effect of the present invention that a number of substrates may be processed simultaneously and a-Si film is not deposited on the inner face of vacuum chamber 11 since the plasma discharge is not generated between the substrate 12 and vacuum chamber 11. As stated previously, the substrate 12 and the vacuum chamber 11 are grounded and possess the same electrical level.

Additionaly, since the starting gas flows evenly and uniformly in the vacuum chamber, a uniform a-Si film can be formed on the substrate 12.

Since the film of the present invention is formed exclusively on the substrate 12 and may not be formed on an unnecessary part in the vacuum chamber 11, the film will not be contaminated by a small piece of a film which is peeled off.

In the above embodiment, it is stated that the holes 13a for evacuation are provided on the cathode electrode 13, however, it may be possible to provide an evacuating means as an independent means. It is also available to interchangeably use introducing unit 15 and evacuating unit 14 so as to cause the starting gas to flow from hole 13a towards the substrate 12. In this case the substrates are preferably placed at a distance of 1 mm or more in order to enhance evacuation.

As disclosed previously, according to the present invention it is possible to improve the deposition effect for forming film on the substrate and minimize a film to be deposited on an undesirable part of the member, other than the substrate, thereby causing a contaminant on the film. Additionally, the properties of film deposited on the substrate can be formed uniformly and the substrate can be prepared in an industrial process.

What we claim is:

1. An apparatus for a plasma CVD process which comprises:
   (a) a vacuum chamber;
   (b) a central electrode for use as a gas collection port in said vacuum chamber;
   (c) means for holding a plurality of substrates in said vacuum chamber circumferentially surrounding said central electrode with gaps between adjacent substrates; and
   (d) means for passing a starting gas through said gaps in a direction radially along a path from the periphery of said vacuum chamber to a central point at said central electrode, said vacuum chamber being capable of generating a plasma atmosphere within the space circumscribed by said substrates.

2. An apparatus according to claim 1, wherein each substrate is placed on a rotating means.

3. An apparatus according to claim 1, wherein the substrate is in a cylinder type.

4. An apparatus according to claim 1, wherein a heating means is provided for heating the substrate.

5. An apparatus according to claim 1, wherein the substrates are used as electrodes.

6. The apparatus according to claim 1 wherein the electrode which generates the plasma atmosphere is hollow and foraminous and constitutes the means for passing a starting gas through gaps between the adjacent substrates.

* * * * *

UNITED STATES PATENT AND TRADEMARK OFFICE
CERTIFICATE OF CORRECTION

PATENT NO. : 4,909,183
DATED : March 20, 1990
INVENTOR(S) : Osamu Kamiya, et al

It is certified that error appears in the above-identified patent and that said Letters Patent is hereby corrected as shown below:

ON THE TITLE PAGE:

IN [56] REFERENCES CITED

U.S. PATENT DOCUMENTS, "Shimatoni et al." should read --Shimatani et al.--

COLUMN 2

Line 21, "a" should read --the--.

COLUMN 3

Line 39, "herein below)" should read --hereinbelow)--.

COLUMN 4

Line 1, "Additionaly," should read --Additionally,--.
Line 15, "hole 13a" should read --holes 13a--.
Line 45, "in" should read --of--.

Signed and Sealed this

Eighteenth Day of February, 1992

Attest:

HARRY F. MANBECK, JR.

*Attesting Officer*     *Commissioner of Patents and Trademarks*